(12) United States Patent
Niwa

(10) Patent No.: US 6,955,973 B2
(45) Date of Patent: Oct. 18, 2005

(54) METHOD FOR FORMING A SEMICONDUCTOR DEVICE

(75) Inventor: Masaaki Niwa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/314,159

(22) Filed: Dec. 9, 2002

(65) Prior Publication Data

US 2003/0109114 A1 Jun. 12, 2003

(30) Foreign Application Priority Data

Dec. 11, 2001 (JP) ........................................ 2001-377201

(51) Int. Cl.⁷ ............................................. H01L 21/76
(52) U.S. Cl. ..................................................... 438/431
(58) Field of Search ......................................... 438/431

(56) References Cited

U.S. PATENT DOCUMENTS

| | | | | |
|---|---|---|---|---|
| 4,432,035 A | * | 2/1984 | Hsieh et al. ................ | 361/322 |
| 5,904,574 A | * | 5/1999 | Nishijima ................... | 438/758 |
| 5,908,509 A | * | 6/1999 | Olesen et al. ................ | 134/1.3 |
| 5,977,581 A | * | 11/1999 | Thakur et al. .............. | 257/310 |
| 6,020,243 A | * | 2/2000 | Wallace et al. ............. | 438/287 |
| 6,184,072 B1 | * | 2/2001 | Kaushik et al. ............. | 438/197 |
| 6,534,420 B2 | * | 3/2003 | Ahn et al. ................... | 438/768 |
| 6,613,677 B1 | * | 9/2003 | Herbots et al. ............. | 438/694 |
| 6,699,747 B2 | * | 3/2004 | Ruff et al. .................. | 438/240 |

FOREIGN PATENT DOCUMENTS

JP    2002-184773    6/2002

OTHER PUBLICATIONS

S. Wolf and R.N. Tauber, "Silicon Processing for the VLSI Era", vol. 1, Lattice Press, pp. 57–58, 218–219.*
Heiji Watanabe, Proc. of the 48th Meeting of the Japan Society of Applied Physics and Related Societies, "30p–YF–10", p. 859, 2001.3.
Niwa et al., "$SIO_2$/SI Interfaces Studied by Scanning Tunneling Microscopy and High Resolution Transmission Electron Microscopy": J. Electrochem. Soc., vol. 139, No. 3, Mar. 1992; p. 901–906.

* cited by examiner

Primary Examiner—Thao P. Le
(74) Attorney, Agent, or Firm—McDermott Will & Emery LLP (57) ABSTRACT

A metal film containing a metal is formed on a silicon layer, and then a surface portion of the silicon layer and the metal film are oxidized so as to form a silicon oxide film containing the metal in a surface portion of the silicon layer.

23 Claims, 4 Drawing Sheets

METHOD FOR FORMING A SEMICONDUCTOR DEVICE

BACKGROUND OF THE INVENTION

The present invention relates to a semiconductor device having a three-layer structure of metal-insulator-semiconductor, and a method for manufacturing the same, and more particularly to a field effect transistor using a metal oxide film having a high dielectric constant as a gate insulating film material, and a method for manufacturing the same.

A type of field effect transistor (hereinafter referred to as "FET") used in the prior art is a MOSFET having a three-layer structure of metal-insulator-semiconductor. As MOSFETs are miniaturized at a significant rate, the thickness of a conventional gate oxide film has been reduced at an accelerated rate. The thickness of a gate oxide film is now as small as about 2 nm. However, when the physical thickness of a gate oxide film is reduced below about 2 nm, the transmittance of electrons through the gate oxide film increases dramatically, resulting in an excessive tunnel leak current flowing between the gate electrode and the substrate, which makes it difficult to even realize a transistor operation of the MOSFET. Moreover, when the physical thickness of a gate oxide film is reduced below about 2 nm, it is no longer possible to maintain the uniformity in the thickness of the gate oxide film. These problems mean that one can no longer expect the main purpose of a MOSFET, i.e., to increase the on state current. In order to overcome such a physical limit, attempts have been made quite recently to use an insulative film having a higher dielectric constant than a silicon oxide film (a high-k film) as a gate insulating film. These attempts aim to realize a physical thickness that is larger than the limit value (about 2 nm) and a large capacitance of gate insulating film, thereby making it possible to obtain a large on state current while suppressing the leak current as much as possible. Note that a high-k film is typically an insulative metal oxide film.

A semiconductor device of a first conventional example, specifically a MOSFET using a high-k gate insulating film, will now be described with reference to the drawings.

FIG. 4A to FIG. 4D are cross-sectional views of a gate section, illustrating steps in a method for manufacturing the semiconductor device of the first conventional example. Note that steps such as the well formation, the isolation formation, the ion implantation for threshold control, and also the contact formation and the subsequent steps, will not be described below.

Figure 4A:
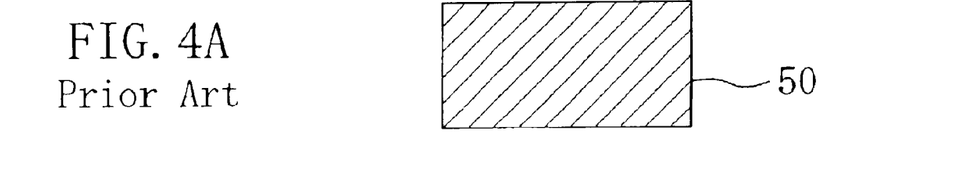
FIG. 4A to FIG. 4D are cross-sectional views illustrating steps in a conventional method for manufacturing a semiconductor device.
Figure 4B:
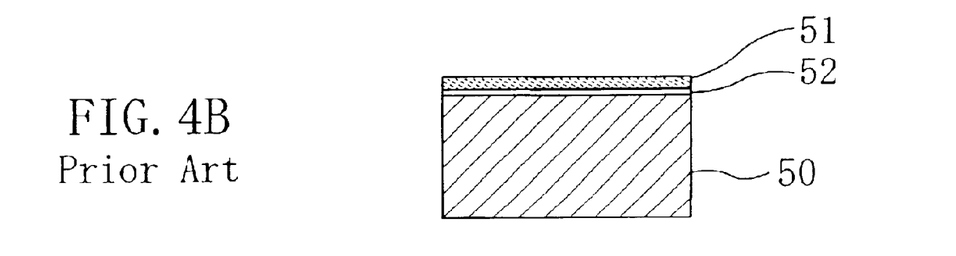

First, a silicon substrate 50 is prepared, as illustrated in FIG. 4A, and then an $HfO_2$ film 51 is formed on the silicon substrate 50 by using a chemical vapor deposition method (hereinafter referred to as "CVD method"), as illustrated in FIG. 4B. Specifically, a CVD process is performed at 500° C. in an oxygen gas atmosphere using $Hf(OC(CH_3)_3)_4$ (hereinafter referred to as "Hf-t-butoxide") as a material so as to deposit the $HfO_2$ film 51 having a thickness of 6 nm. In this process, a hafnium silicate ($HfSi_xO_y$ (where x+y=1, x>0, y>0)) layer 52 is necessarily formed between the silicon substrate 50 and the $HfO_2$ film 51, i.e., at an interface of the silicon substrate 50 with the $HfO_2$ film 51, by an interface reaction occurring due to the CVD process. The two-layer structure of the upper $HfO_2$ film 51 and the lower $HfSi_xO_y$ layer 52 provides a high-k gate insulating film. Typically, the $HfO_2$ film 51 is a polycrystalline layer, and the $HfSi_xO_y$ layer 52 is an amorphous layer. Note that in a case where a physical vapor deposition method (hereinafter referred to as "PVD method") is used instead of a CVD method, the degree of crystallization of the $HfO_2$ film immediately after deposition is slightly lower than that when a CVD method is used.

Figure 4C:
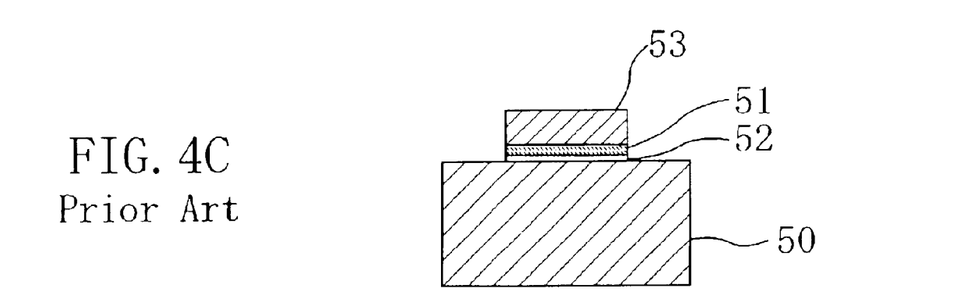

Then, the $HfO_2$ film 51 is subjected to a heat treatment for 30 seconds at 800° C. in a nitrogen gas atmosphere so as to stabilize the stoichiometric composition ratio of the $HfO_2$ film 51. Then, a conductive film made of a conductive material such as polysilicon is deposited on the $HfO_2$ film 51, and then the conductive film is patterned by dry-etching so as to form a gate electrode 53, as illustrated in FIG. 4C. In this process, a portion of each of the $HfO_2$ film 51 and the $HfSi_xO_y$ layer 52 that is located outside the gate electrode 53 is removed.

Figure 4D:
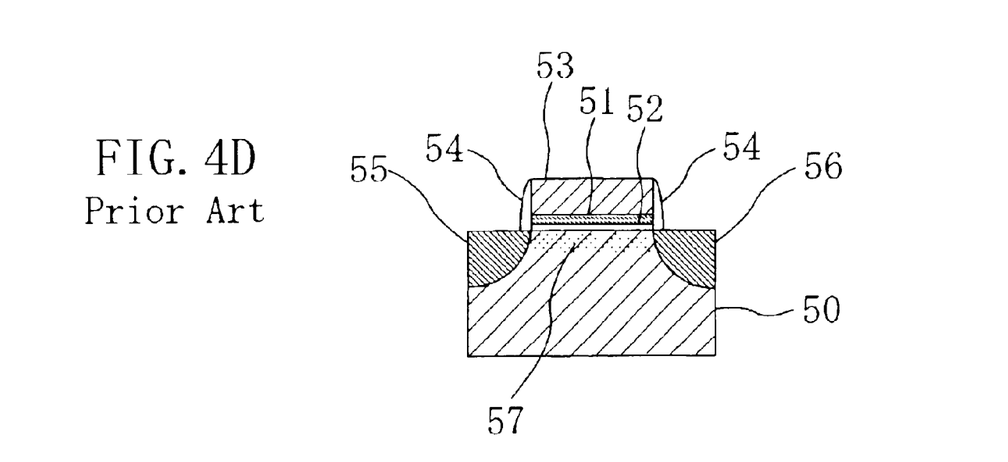

Then, a silicon oxide film is formed on the surface of the silicon substrate 50, including the surface of the gate electrode 53, and then the silicon oxide film is etched back so that the silicon oxide film is left unremoved only on the side surface of the gate electrode 53, thereby forming a sidewall 54, as illustrated in FIG. 4D. Then, an ion implantation process is performed on the silicon substrate 50 so that a source region 55 and a drain region 56, in which an impurity is diffused at a high concentration, are formed in upper portions of the silicon substrate 50 that are on opposite sides of the gate electrode 53. In this process, ions are also implanted into the polysilicon film forming an upper portion of the gate electrode 53. Then, a heat treatment is performed on the silicon substrate 50 at 900° C. in a nitrogen gas atmosphere so as to activate the impurity contained in each of the gate electrode 53, the source region 55 and the drain region 56. Note that the sidewall 54 prevents ions from being implanted into a side portion of each of the $HfO_2$ film 51 and the $HfSi_xO_y$ layer 52, which remain under the gate electrode 53, i.e., into a side portion of the gate insulating film.

A MOSFET produced as described above is turned ON/OFF by the presence/absence of a channel 57 in a portion of the silicon substrate 50 immediately under the gate electrode 53, which is, or is not, formed depending on the level of the voltage applied to the gate electrode 53 (hereinafter referred to as "gate voltage"). The level "Idmax" of the on state current, which flows through the channel 57 when the transistor is ON is expressed as follows:

$$Idmax = (\tfrac{1}{2}) \cdot \mu \cdot (W/L) \cdot Cox \cdot (Vg - Vth)^2$$

where $\mu$ is the carrier mobility through the inversion layer to be the channel, W is the gate width of the transistor, L is the gate length of the transistor, Cox is the capacitance of the gate insulating film (hereinafter referred to as "gate capacitance"), Vg is the gate voltage, and Vth is the threshold voltage.

It can be seen from the expression above that it is important to increase $\mu$, W, Cox or (Vg−Vth), or to decrease L, in order to obtain a larger on state current. Herein, in order to increase Cox, it is necessary to increase the relative dielectric constant $\epsilon_r$ of the gate insulating film, or to decrease the physical thickness Tox of the gate insulating film. Thus, among the factors mentioned above, those that are related to the gate insulating film are an increase in $\mu$, an increase in the relative dielectric constant $\epsilon_r$, and a decrease in the physical thickness Tox of the gate insulating film. In view of this, attempts have been made in the prior art in order to improve the on state current, such as increasing $\mu$ by flattening the interface between the gate oxide film and the silicon substrate, or realizing a super thin gate oxide film by decreasing the physical thickness Tox thereof (oxide film thickness). However, the approach to thin the gate oxide film reaches its limit at about 2 nm or less as described above. Therefore, aiming to increase the relative dielectric constant $\epsilon_r$, the use of a high-k film as a gate insulating film has recently been discussed seriously. Typically, such a high-k film is formed by using a CVD method, including an atomic layer deposition (ALD) method, or a PVD method by sputtering or vapor deposition.

In the case of the first conventional example (see FIG. 4A to FIG. 4D), the $HfSi_xO_y$ layer 52, which is an interface reaction layer, grows when forming the $HfO_2$ film 51, which is a high-k film. As a result, the equivalent oxide thickness (hereinafter referred to as "EOT") of the gate insulating film as a whole increases. On the other hand, another method (hereinafter referred to as "second conventional example") is proposed in the art, in which the entailing growth of the interface reaction layer is suppressed by vacuum reoxidation process, thereby sharpening the change of the composition distribution at the interface between the silicon substrate and the high-k film (Heiji Watanabe, Proc. of the 48th Meeting of the Japan Society of Applied Physics and Related Societies, 30p-YF-10, p. 859, 2001.3). Specifically, in the second conventional example, a chemical oxide having a thickness of 0.6 nm is formed on a silicon wafer, and then a thin zirconium (Zr) film is deposited thereon by electron beam evaporation, after which the silicon wafer is oxidized in an oxygen atmosphere that is depressurized to a ultra-high vacuum state (about $1.33 \times 10^{-2}$ Pa), thereby producing a $ZrO_2/SiO_2/Si$ layered structure.

With the first and second conventional examples, however, it is often the case that the device has a short lifetime, for which the device operates reliably, or poor insulation characteristics, as compared with a thermal oxide film of the same electrical thickness (i.e., a thermal oxide film with a smaller physical thickness but the same gate capacitance) and, needless to say, as compared with a gate oxide film (thermal oxide film) of the same physical thickness.

Moreover, in the first conventional example, it is known that the characteristics of the interface between a silicon substrate and a high-k film (hereinafter referred to as "Si/high-k interface") are more likely to deteriorate than the interface between a silicon substrate and a thermal oxide film (hereinafter referred to as "Si/SiO$_2$ interface"), and a large number of interface states occur at the Si/high-k interface. On the other hand, in the thermal oxide film, a strain occurs at the Si/SiO$_2$ interface as its volume increases in the thermal oxidation process. This strain induces structural defects, thereby creating an interface state that functions as a carrier trap site, thus giving various adverse effects on the characteristics of the MOSFET, e.g., a dielectric breakdown of the gate oxide film or a decrease in the carrier mobility through the channel. However, since the degree of deterioration of transistor characteristics due to a gate oxide film is not so serious as compared with that due to a high-k gate insulating film, thermal oxide films have long been used as gate insulating films.

Furthermore, in the first conventional example, in addition to the presence of more interface states at an Si/high-k interface than at an Si/SiO$_2$ interface, a high-k film has more fixed charge therein than a thermal oxide film, thereby resulting in increased scattering of carriers in the channel and thus deteriorating the mobility characteristics.

Thus, it is desirable to provide a gate insulating film that has Si/SiO$_2$ interface characteristics and a small EOT.

However, when a high-k film is deposited on an underlying oxide film (chemical oxide) on a silicon substrate, as in the second example, unexpected interface states occur at the Si/high-k interface, thereby leading to an increase in the leak current via the interface states.

SUMMARY OF THE INVENTION

The present invention has been made in view of the above, and has an object to realize a reliable high-k film with desirable insulation and mobility characteristics.

In order to achieve the object set forth above, the present inventor has conducted an in-depth research on possible causes for the short lifetime, for which the device operates reliably, or the poor insulation characteristics in the first and second conventional examples, and has obtained the following findings.

A high-k film is less complete than a thermal oxide film in terms of amorphousness (specifically, it is more easily turned into a polycrystalline state), and is more prone to the formation of conductive defects. As a result, when a voltage is applied to a high-k film, conductive defects formed in the high-k film are easily connected together via the crystal grain boundaries (polycrystalline grain boundaries). Therefore, it is assumed that a leak current path (leak path) is more easily formed in a high-k film as compared with when a voltage is applied to a thermal oxide film of the same electrical thickness (in this case, the high-k film has a larger physical thickness). It may also be possible that a leak path, or a leak current, is more likely to occur in a high-k film because of the large number of impurity levels that are present in the vicinity of the mid-gap (a central portion of the band gap) in the polycrystalline grain boundaries of the high-k film, via which such a leak path, or a leak current, can occur.

Moreover, a conventional amorphous high-k film has a problem in terms of heat resistance. Specifically, while it is necessary for putting a high-k gate insulating film into practical use to perform various heat treatments such as an activation heat treatment after the conventional low-temperature formation of an amorphous high-k film, these heat treatments destroy the amorphous structure of the high-k film and turn it into a polycrystalline structure. As a result, even if an amorphous high-k film immediately after deposition has a significantly suppressed leak current as compared with a thermal oxide film, the high-k film cannot continue to suppress the leak current therethrough after it is turned into a polycrystalline state through the subsequent high-temperature heat treatments, as described above. Thus, the high-k film can no longer function as a gate insulating film.

The present inventor has conceived the present invention as set forth below in view of these problems that have heretofore hindered the practical use of a high-k gate insulating film.

Specifically, a method for forming an insulative film of the present invention includes the steps of: forming a metal film containing a metal on a silicon layer; and oxidizing the metal film together with a surface portion of the silicon layer so as to form a silicon oxide film containing the metal in a surface portion of the silicon layer.

According to the method for forming an insulative film of the present invention, a metal film on a silicon layer is oxidized together with a surface portion of the silicon layer so as to form a silicon oxide film, which contains the metal that is forming the metal film, in a surface portion of the silicon layer. Since the metal-containing silicon oxide film formed in this manner has an equivalent level of amorphousness to that of a thermal oxide film, a leak path due to crystal grain boundaries is not likely to occur, whereby the leak current can be reduced significantly. Moreover, since the metal-containing silicon oxide film has a similar composition to that of a thermal oxide film, it can be a high-k film having a desirable heat resistance. Furthermore, as the oxidation process progresses downward with respect to the surface of the silicon layer before it is oxidized. As a result, the interface between the metal-containing silicon oxide film and the silicon layer has desirable interface characteristics, in which the trap level is reduced and the carrier scattering through the channel is reduced, as those of the interface between a thermal oxide film and a silicon layer. Thus, it is possible to realize a gate insulating film or a capacitor insulating film that is reliable and has desirable insulation and mobility characteristics, while achieving a very small electrical thickness that is even smaller than the limit value for the thickness of a thermal oxide film. Therefore, in a case where the metal-containing silicon oxide film of the present invention is used as a gate insulating film, for example, it is possible to suppress the gate leak current and reduce the power consumption without deteriorating the on state current of the transistor, whereby it is possible to manufacture a high-speed transistor with a very small stand-by power.

In the method for forming an insulative film of the present invention, it is preferred that the step of forming the silicon oxide film includes a step of performing a thermal oxidation process on the surface portion of the silicon layer and the metal film.

In this way, it is possible to easily and reliably form the metal-containing silicon oxide film. Moreover, the high level of amorphousness of the metal-containing silicon oxide film is maintained even at high temperatures, as that of a thermal oxide film, and thus the heat resistance of the metal-containing silicon oxide film is improved.

In a case where a thermal oxidation process is performed on a metal film, it is preferred that the thermal oxidation process is a rapid thermal oxidation process. Preferably, the rapid thermal oxidation process is performed in a pyrogenic atmosphere, in which case it is possible to further reduce the interface states occurring between the metal-containing silicon oxide film and the silicon layer and to further stabilize the composition of the metal-containing silicon oxide film. Moreover, if the rapid thermal oxidation process is performed by using infrared rays, it is possible to form the metal-containing silicon oxide film with a very small thickness.

In the method for forming an insulative film of the present invention, it is preferred that the step of forming the silicon oxide film includes a step of performing a plasma oxidation process on the surface portion of the silicon layer and the metal film.

In this way, a metal-containing silicon oxide film can be formed at a lower temperature as compared with a conventional thermal oxide film. Moreover, in such a case, if the plasma oxidation process is performed by using an oxygen radical or ozone, the interface between the metal-containing silicon oxide film and the silicon layer can be flattened. Therefore, in a case where the metal-containing silicon oxide film is used as a gate insulating film, for example, the carrier mobility of the transistor is improved.

In the method for forming an insulative film of the present invention, it is preferred that the step of forming the silicon oxide film includes the step of performing an electrolytic oxidation process on a surface portion of the silicon layer and the metal film.

In this way, when forming a multi-oxide, for example, only a metal film (and a surface portion of the silicon layer under the metal film) that corresponds to a circuit portion for which a high-speed operation is required can be selectively oxidized into a high-k film. Such selective oxidation can be done as follows in a case where an oxide film is formed on a silicon substrate, for example. In an electrolytic oxidation process, a voltage is applied between the silicon substrate and a conductive probe that is brought close to the silicon substrate, i.e., at a distance of several nanometers from the silicon substrate, in the atmospheric air, for example, so as to form a good-quality oxide film on the surface of the silicon substrate through anodic oxidation. In this process, the oxide film can be selectively formed in any intended location on the silicon substrate by direct writing with the conductive probe using a scanning probe microscope, for example.

In the method for forming an insulative film of the present invention, it is preferred that the metal includes a group III element such as a lanthanoid, an actinoid or aluminum, or a group IV element such as hafnium or zirconium.

In this way, it is possible to reliably increase the dielectric constant of the metal-containing silicon oxide film.

A method for manufacturing a semiconductor device of the present invention includes the steps of: forming a metal film containing a metal on a silicon layer; oxidizing the metal film together with a surface portion of the silicon layer so as to form a silicon oxide film containing the metal; and forming an electrode on the silicon oxide film.

Since the method for manufacturing a semiconductor device of the present invention employs the metal-containing silicon oxide film of the present invention as a gate insulating film or a capacitor insulating film, effects as those of the method for forming an insulative film of the present invention can be obtained.

In the method for manufacturing a semiconductor device, it is preferred that the electrode is made of a metal material.

In this way, a depletion layer is not formed inside the electrode when a voltage is applied to the electrode, whereby the effective equivalent oxide thickness can be reduced by the thickness of the depletion layer, as compared with a case where a polysilicon electrode is used.

A semiconductor device of the present invention includes: a silicon oxide film that is formed on a silicon layer and is to be a gate insulating film or a capacitor insulating film; and an electrode formed on the silicon oxide film, wherein the silicon oxide film contains hafnium, zirconium or lanthanum.

Since the semiconductor device of the present invention employs the metal-containing silicon oxide film of the present invention as a gate insulating film or a capacitor insulating film, effects as those of the method for forming an insulative film of the present invention can be obtained.

DETAILED DESCRIPTION OF THE INVENTION

First Embodiment

A semiconductor device, and a method for manufacturing the same, according to the first embodiment of the present invention will now be described with reference to the drawings for a MOSFET that uses a metal oxide as the insulator in a three-layer structure of metal-insulator-semiconductor.

FIG. 1A to FIG. 1D are cross-sectional views illustrating steps in the method for manufacturing a semiconductor device according to the first embodiment of the present invention. Note that steps such as the well formation, the isolation formation, the ion implantation for threshold control, and also the contact formation and the subsequent steps, will not be described below.

Figure 1A:
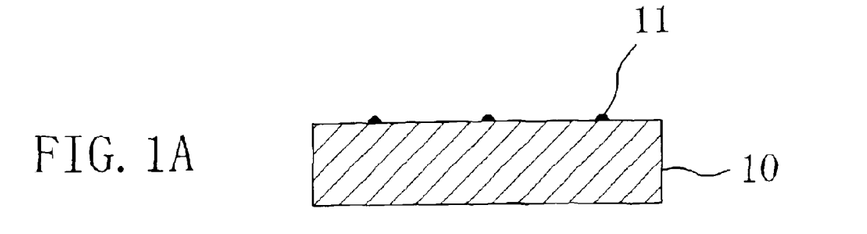
FIG. 1A to FIG. 1D are cross-sectional views illustrating steps in a method for manufacturing a semiconductor device according to the first embodiment of the present invention.

First, wet processes such as a pre-oxidation process, for example, are performed on the (001) surface of a silicon substrate 10, as illustrated in FIG. 1A. Specifically, cleaning with hot water, cleaning with buffered hydrogen fluoride into which a hydrogen peroxide solution is mixed, or cleaning with an improved SC-1 solution having an increased hydrogen peroxide solution concentration, and removing process of chemical oxide film with dilute hydrogen fluoride, are performed repeatedly on the silicon substrate 10. By this process, the (001) surface of the silicon substrate 10 is cleaned. Note however that upon completion of the wet processes, a very slight amount of a surface contaminant 11 such as carbon or moisture remains on the (001) cleaned surface of the silicon substrate 10.

Figure 1B:
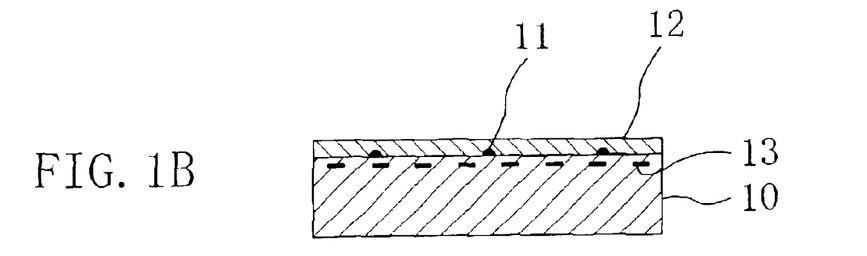

Then, a thin metal film, specifically a metal hafnium (Hf) layer 12, is formed by a PVD method on the (001) cleaned surface of the silicon substrate 10, as illustrated in FIG. 1B. Specifically, the silicon substrate 10 is carried into a chamber of a reactive sputtering apparatus (not shown) having a target made of metal hafnium in the chamber, with the chamber atmosphere being set to an argon atmosphere at a pressure of 400 Pa, and an electric discharge is created for 10 seconds with power of 100 W, thereby forming the metal hafnium layer 12 having a thickness of about 1.2 nm. In this process, a mixing layer (not shown) due to sputtering, or a defect 13 due to a sputtering damage, may occur in the surface of the silicon substrate 10, i.e., under the metal hafnium layer 12.

Figure 1C:
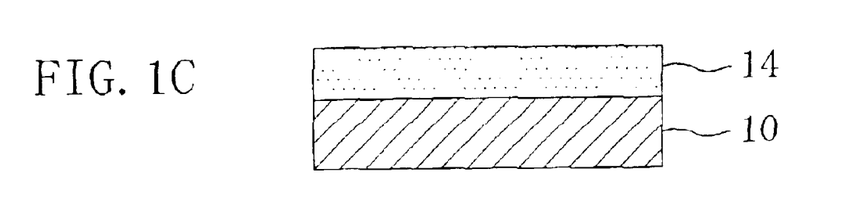

Then, the metal hafnium layer 12 and a surface portion of the silicon substrate 10 are subjected to a thermal oxidation process, e.g., a rapid thermal oxidation process, thereby forming an Hf-containing silicon oxide film 14 to be a gate insulating film in a surface portion of the silicon substrate 10, as illustrated in FIG. 1C. In this way, the surface contaminant 11 and the defect 13 are taken into the Hf-containing silicon oxide film 14. Specifically, the silicon substrate 10 with the metal hafnium layer 12 formed thereon is carried into a chamber, and then the inside of the chamber is maintained at a steady state of a pyrogenic atmosphere at a pressure of about 1330 Pa into which 2% by volume and 98% by volume of a hydrogen gas and an oxygen gas, respectively, are mixed. Then, an infrared instantaneous heating process of about 1000° C. using a lamp is performed on the metal hafnium layer 12 and a surface portion of the silicon substrate 10 in the chamber for about 30 seconds, thereby forming the Hf-containing silicon oxide film 14 having a thickness of about 4 nm.

Figure 1D:
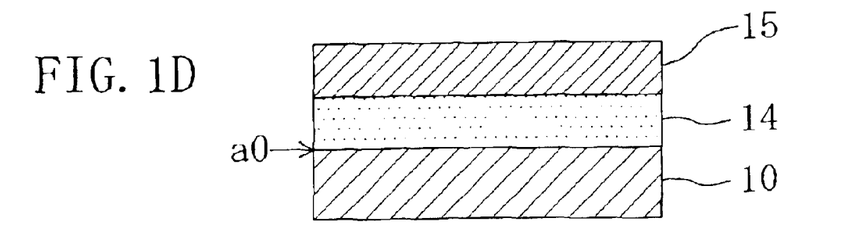

Then, a conductive film 15 to be a gate electrode is formed on the Hf-containing silicon oxide film 14, as illustrated in FIG. 1D. Thus, a MOS structure is produced. Specifically, a reactive sputtering process is performed in a mixed atmosphere of an argon gas and a nitrogen gas so as to successively deposit a tungsten nitride film having a thickness of 10 nm and a tungsten film having a thickness of 100 nm, thereby forming the conductive film 15. In this process, the layered structure of a tungsten nitride film and a tungsten film is realized by adjusting the flow rate ratio of the nitrogen gas with respect to the argon gas within a range of 0 to 80%. Then, the conductive film 15 is subjected to a heat treatment using an electric furnace in a nitrogen gas at about 750° C. for about 30 minutes. Then, although not shown, the conductive film 15 is patterned by dry-etching so as to form the gate electrode, and a sidewall is formed on the side surface of the gate electrode, after which an impurity diffusion layer to be a source region and a drain region is formed in the silicon substrate 10. Note that ion implantation for the gate electrode is not necessary because the gate electrode formed in the present embodiment is a tungsten gate electrode.

In a MOSFET produced as described above is turned ON/OFF according to the level of the voltage applied to the tungsten gate electrode.

Figure 2:
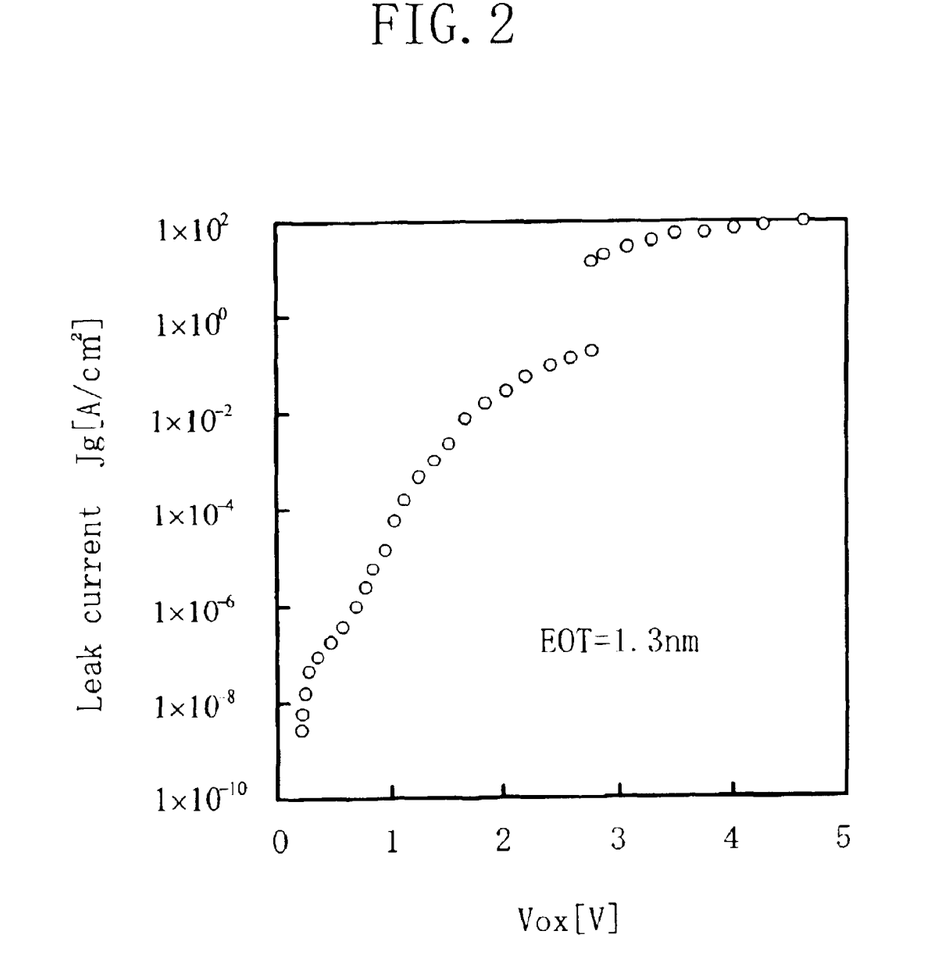
FIG. 2 is a graph illustrating the I-V characteristics of a MOSFET produced by the method for manufacturing a semiconductor device according to the first embodiment of the present invention.

FIG. 2 shows the I-V characteristics (current-voltage characteristics) of a MOSFET produced by the method for manufacturing a semiconductor device according to the first embodiment of the present invention illustrated in FIG. 1A to FIG. 1D. In FIG. 2, the horizontal axis represents Vox (=gate voltage Vg–threshold voltage Vth), and the vertical axis represents the leak current Jg.

As shown in FIG. 2, in the first embodiment, the leak current Jg is about $1 \times 10^{-4}$ A/cm$^2$ when Vox is 1.0 V, for example, thus confirming that the leak current Jg is suppressed sufficiently. Note that the EOT of the Hf-containing silicon oxide film 14 of the first embodiment was calculated to be 1.3 nm based on the C-V characteristics (capacitance-voltage characteristics).

Moreover, the interface state density, which is believed to represent a characteristic of the interface between the silicon substrate 10 and the Hf-containing silicon oxide film 14 in the MOSFET of the present embodiment, was obtained by using a charge pumping method (a method in which a pulse voltage is applied to the gate electrode, and a current that flows through the substrate is measured). As a result, the interface state density was estimated to be about $0.5 \times 10^{11}$/(cm$^2 \cdot$eV) at each energy level in the mid-gap (a central portion of the band gap) of the interface. This value is equivalent to the interface state density of an SiO$_2$/Si interface, indicating that the interface state density is significantly reduced from that of a conventional high-k film.

Moreover, the fixed charge density Df in the Hf-containing silicon oxide film 14 was measured to be about $2 \times 10^{11}$/cm$^2$, indicating a significant reduction from the fixed charge density Df (about $1 \times 10^{12}$/cm$^2$) of a high-k film that is deposited after forming a super thin underlying oxide layer (the second conventional example).

Moreover, the defect density in the Hf-containing silicon oxide film 14 was measured, by using photoluminescence measurement, to be about one half of that of a thermal oxide film (SiO$_2$ film) formed by an ordinary rapid thermal oxidation.

Furthermore, the density of the Hf-containing silicon oxide film 14 was measured, by using X-ray photoelectron spectroscopy, to be 2.2 g/cm$^3$ substantially uniformly from the interface with the silicon substrate 10 to the interface with the tungsten gate electrode (conductive film 15).

It is believed that the desirable characteristics, as described above, of the Hf-containing silicon oxide film 14 as a high-k film can be obtained for the following reason.

According to the first embodiment, the Hf-containing silicon oxide film 14 is formed in a surface portion of the silicon substrate 10 by oxidizing the metal hafnium layer 12 on the silicon substrate 10 together with a surface portion of the silicon substrate 10. Since the Hf-containing silicon oxide film 14 formed in this manner has an equivalent level of amorphousness to that of a thermal oxide film, a leak path due to crystal grain boundaries is not likely to occur, whereby the leak current can be reduced significantly. Moreover, since the Hf-containing silicon oxide film 14 has a similar composition to that of a thermal oxide film, it can be a high-k film having a desirable heat resistance. Furthermore, as the oxidation process time increases, the interface a0 (see FIG. 1D) between the Hf-containing silicon oxide film 14 and the silicon substrate 10 moves downward with respect to the surface of the silicon substrate 10 before it is oxidized. Therefore, the surface contaminant 11 such as carbon or moisture on the silicon substrate 10, and the mixing layer or the defect 13 (i.e., a substrate damaged layer) occurring due to sputtering, are taken into the Hf-containing silicon oxide film 14. As a result, the interface a0 between the Hf-containing silicon oxide film 14 and the silicon substrate 10 has desirable interface characteristics, in which the trap level is reduced and the carrier scattering through the channel is reduced, as those of the interface between a thermal oxide film and a silicon substrate, whereby the transistor characteristics are not affected.

Therefore, by using the Hf-containing silicon oxide film 14 as a high-k film, it is possible to realize a sufficiently high dielectric constant as compared with, for example, a silicon nitride film or an aluminum oxide film (note however that the dielectric constant of the Hf-containing silicon oxide film 14 is slightly lower than that of a $HfO_2$ film, for example), while maintaining a high quality. Thus, with the Hf-containing silicon oxide film 14, it is possible to realize a reliable gate insulating film having desirable insulation and mobility characteristics, while achieving a very small electrical thickness that is even smaller than the limit value for the thickness of a thermal oxide film. Therefore, it is possible to suppress the gate leak current and reduce the power consumption without deteriorating the on state current of the transistor, whereby it is possible to manufacture a high-speed transistor with a very small stand-by power.

Moreover, according to the first embodiment, the Hf-containing silicon oxide film 14 is formed by performing a thermal oxidation process on the metal hafnium layer 12 and a surface portion of the silicon substrate 10, whereby it is possible to easily and reliably form the Hf-containing silicon oxide film 14. Moreover, the high level of amorphousness of the Hf-containing silicon oxide film 14 is maintained even at high temperatures, as that of a thermal oxide film, and thus the heat resistance of the Hf-containing silicon oxide film 14 is improved. Thus, the Hf-containing silicon oxide film 14 allows for a heat resistance improvement that cannot be realized by a conventional high-k film.

It is known in the art that oxidation of a silicon layer with an oxygen radical is typically advantageous over an ordinary thermal oxidation process using an electric furnace in that the former oxidation process allows an oxide film having a smooth interface with the silicon layer to be formed in a short period of time, if the thickness of the oxide film is small, because of the high oxidation rate in an initial oxidation stage and the high activity of the oxygen radical. On the other hand, in the first embodiment, the Hf-containing silicon oxide film 14 is formed by performing a rapid thermal oxidation process in a pyrogenic atmosphere on the metal hafnium layer 12 on the silicon substrate 10 and a surface portion of the silicon substrate 10. In such a case, the metal hafnium layer 12 and the silicon substrate 10 are oxidized by a reactive species such as atomic oxygen, whereby the Hf-containing silicon oxide film 14 is formed uniformly across the entire surface of the silicon substrate 10, i.e., across the entire wafer surface, with the composition of the Hf-containing silicon oxide film 14 being kept constant across the film. Thus, the interface states occurring between the Hf-containing silicon oxide film 14 and the silicon substrate 10 can be further reduced, and the composition of the Hf-containing silicon oxide film 14 can be made more stable. Note that it has been found that the primary component of the Hf-containing silicon oxide film 14 is $HfSi_xO_y$ (where x>0 and y>0) produced through the reaction of metal Hf, oxygen and silicon, and is more specifically $HfSiO_4$.

Moreover, according to the first embodiment, the Hf-containing silicon oxide film 14 is formed by performing a rapid thermal oxidation using the heat of an infrared lamp on the metal hafnium layer 12 on the silicon substrate 10 and a surface portion of the silicon substrate 10, whereby the Hf-containing silicon oxide film 14 can be formed to be very thin.

Moreover, according to the first embodiment, the Hf-containing silicon oxide film 14, which is a high-k film, has a good heat resistance as that of a thermal oxide film, whereby a conventional process apparatus for manufacturing a conventional semiconductor device having a thermal oxide film as a gate insulating film can be used, as it is, for manufacturing a semiconductor device having the Hf-containing silicon oxide film 14 as a gate insulating film. Specifically, not only a conventional transistor manufacturing process, but also the front process and the end process thereof, can be used, as they are, thus providing a significant benefit in the manufacture of LSIs.

Moreover, in the first embodiment, the conductive film 15 having a layered structure of a tungsten nitride film and a tungsten film, i.e., a gate electrode made of a metal material, is formed on the Hf-containing silicon oxide film 14 to be a high-k gate insulating film. Therefore, a depletion layer is not formed inside the gate electrode when a voltage is applied to the electrode, whereby the effective equivalent oxide thickness (EOT) can be reduced by the thickness of the depletion layer, as compared with a case where a polysilicon gate electrode is used.

Furthermore, according to the first embodiment, an oxidation process is used for forming a high-k film, which provides the following advantage over the use of a conventional deposition method such as a CVD method for the high-k film formation.

That is, in the case of a conventional technique of forming a metal oxide film to be a high-k film on a silicon substrate by using, for example, a CVD method, it is necessary to form, before the formation of the metal oxide film, a barrier layer made of a silicon nitride film, or the like, on the silicon substrate, in order to suppress the growth of an interface layer between the silicon substrate and the metal oxide film. In contrast, in the first embodiment, the barrier layer formation can be omitted. Moreover, a conventional high-k film, i.e., a metal oxide film, formed by a CVD method needs to be subjected to a heat treatment for stabilizing the composition ratio thereof after the formation of the metal oxide film, whereas the heat treatment can be omitted in the first embodiment. Therefore, according to the first embodiment, the manufacturing process can be simplified as compared with the conventional high-k film formation method, and thus the manufacturing cost can be reduced.

Note that while a rapid thermal oxidation process is performed using infrared rays in a pyrogenic atmosphere for forming the Hf-containing silicon oxide film 14 in the first embodiment, the thermal oxidation method may alternatively be any other suitable method, including an oxidation process using an oxygen radical (hereinafter referred to as "radical oxidation process"), a thermal oxidation process with an electric furnace, an ordinary rapid thermal oxidation process, an electrolytic oxidation process (i.e., an anodic oxidation process in which a metal oxide film is formed by applying an electric field to the metal film to be the anode in a water ($H_2O$)-containing vapor phase), etc. Note however that when the rapid thermal oxidation process using infrared rays in a pyrogenic atmosphere is performed, as in the first embodiment, it is possible to reduce the damage to the silicon substrate, as compared with the radical oxidation process, for example.

Moreover, in the first embodiment, the Hf-containing silicon oxide film 14 to be a gate insulating film is formed by oxidizing the metal hafnium layer 12 on the silicon substrate 10 together with a surface portion of the silicon substrate 10. Alternatively, a metal-containing silicon oxide film to be a gate insulating film may be formed by forming an alternative metal layer containing a group III element (including a group IIIA element and a group IIIB element) such as a lanthanoid, an actinoid or aluminum, or a group IV element such as zirconium, on a silicon substrate, and then oxidizing the alternative metal layer together with a surface portion of the silicon substrate. For example, a metal zirconium (Zr) layer, a metal lanthanum (La) layer, or the like, on a silicon substrate may be oxidized together with a surface portion of the silicon substrate so as to form a Zr-containing silicon oxide film, a La-containing silicon oxide film, or the like, to be a gate insulating film.

Moreover, while tungsten nitride and tungsten are used as the materials of a gate electrode in the first embodiment, other metals, e.g., tantalum nitride or titanium nitride, may alternatively be used. Alternatively, polysilicon may be used as a material of a gate electrode.

Moreover, in the first embodiment, a super thin silicon nitride layer having a thickness of about 0.7 nm may be formed on the silicon substrate 10 by subjecting the silicon substrate 10 to a heat treatment for 20 seconds at 700° C., for example, in an ammonia gas atmosphere, before forming the metal hafnium layer 12 on the silicon substrate 10 in the step of FIG. 1B. The silicon nitride layer is provided for suppressing the interface reaction between the silicon substrate 10 and the metal hafnium layer 12.

Moreover, while the first embodiment is directed to a MOSFET in which a metal-containing silicon oxide film having a high dielectric constant is used as the gate insulating film, the present invention is not limited to this. Needless to say, similar effects can be obtained with any other suitable device using a metal-containing silicon oxide film such as a capacitor using a metal-containing silicon oxide film as a capacitor insulating film, for example.

Second Embodiment

A semiconductor device, and a method for manufacturing the same, according to the second embodiment of the present invention will now be described with reference to the drawings for a MOSFET that uses a metal oxide as the insulator in a three-layer structure of metal-insulator-semiconductor.

FIG. 3A to FIG. 3D are cross-sectional views illustrating steps in the method for manufacturing a semiconductor device according to the second embodiment of the present invention. Note that steps such as the well formation, the isolation formation, the ion implantation for threshold control, and also the contact formation and the subsequent steps, will not be described below.

Figure 3A:
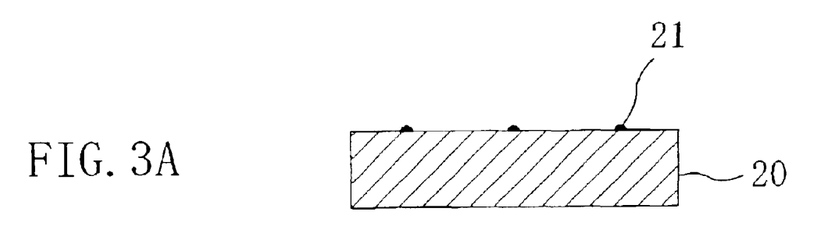
FIG. 3A to FIG. 3D are cross-sectional views illustrating steps in a method for manufacturing a semiconductor device according to the second embodiment of the present invention.

First, wet processes such as a pre-oxidation process, for example, are performed on the (001) surface of a silicon substrate 20, as illustrated in FIG. 3A. Specifically, cleaning with hot water, cleaning with buffered hydrogen fluoride into which a hydrogen peroxide solution is mixed, or cleaning with an improved SC-1 solution having an increased hydrogen peroxide solution concentration, and removing process of chemical oxide film with dilute hydrogen fluoride, are performed repeatedly on the silicon substrate 20. By this process, the (001) surface of the silicon substrate 20 is cleaned. Note however that upon completion of the wet processes, a very slight amount of a surface contaminant 21 such as carbon or moisture remains on the (001) cleaned surface of the silicon substrate 20.

Figure 3B:
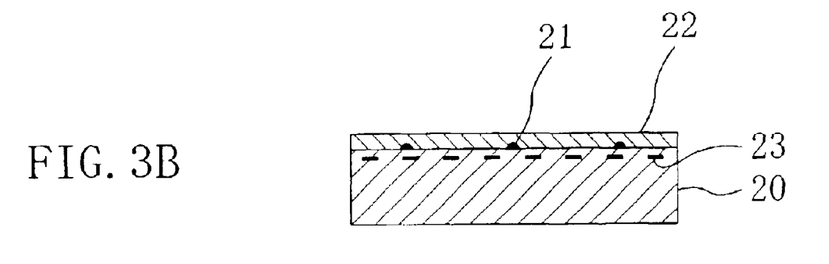

Then, a thin metal film, specifically a metal hafnium (Hf) layer 22, is formed by a PVD method on the (001) cleaned surface of the silicon substrate 20, as illustrated in FIG. 3B. Specifically, the silicon substrate 20 is carried into a chamber of a reactive sputtering apparatus (not shown) having a target made of metal hafnium in the chamber, with the chamber atmosphere being set to an argon atmosphere at a pressure of 400 Pa, and an electric discharge is created for 10 seconds with power of 100 W, thereby forming the metal hafnium layer 22 having a thickness of about 1.2 nm. In this process, a mixing layer (not shown) due to sputtering, or a defect 23 due to a sputtering damage, may occur in the surface of the silicon substrate 20, i.e., under the metal hafnium layer 22.

Figure 3C:
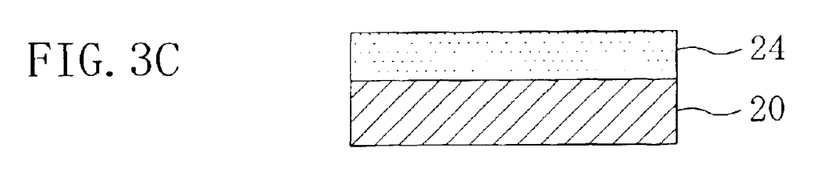

Then, the metal hafnium layer 22 and a surface portion of the silicon substrate 20 are subjected to a plasma oxidation process, e.g., an oxidation process using a plasma containing an oxygen radical, thereby forming an Hf-containing silicon oxide film 24 to be a gate insulating film in a surface portion of the silicon substrate 20, as illustrated in FIG. 3C. In this way, the surface contaminant 21 and the defect 23 are taken into the Hf-containing silicon oxide film 24. Specifically, the silicon substrate 20 with the metal hafnium layer 22 formed thereon is carried into a chamber of a plasma oxidation apparatus, and then the inside of the chamber is maintained to be an oxygen atmosphere at a pressure of about 665 Pa. Then, the substrate temperature is set to be about 800° C., and a plasma oxidation process (i.e., a radical oxidation process) is performed on the metal hafnium layer 22 and a surface portion of the silicon substrate 20 with a microwave power of 100 W, thereby forming the Hf-containing silicon oxide film 24 having a thickness of about 5.3 nm. In this process, the thickness of the Hf-containing silicon oxide film 24 is adjusted by the oxidation time. Typically, when a radical oxidation process is performed on the (001) surface of a silicon substrate, an oxide film (radical oxide film) having a physical thickness of about 3.5 nm is obtained for an oxidation time of 3 minutes. In contrast, in the second embodiment, the Hf-containing silicon oxide film 24 having a physical thickness of about 5.3 nm is obtained for the same oxidation time of about 3 minutes.

Figure 3D:
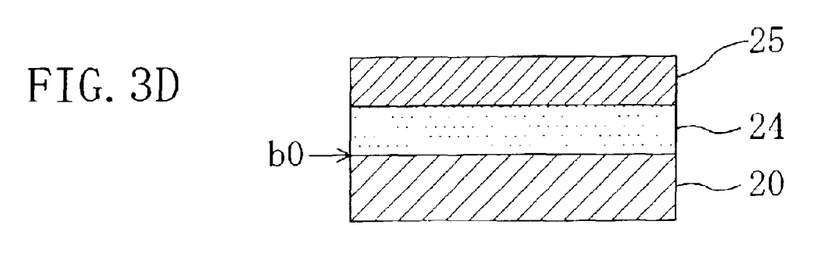

Then, a conductive film 25 to be a gate electrode is formed on the Hf-containing silicon oxide film 24, as illustrated in FIG. 3D. Thus, a MOS structure is produced. Specifically, a reactive sputtering process is performed in a mixed atmosphere of an argon gas and a nitrogen gas so as to successively deposit a tungsten nitride film having a thickness of 10 nm and a tungsten film having a thickness of 100 nm, thereby forming the conductive film 25. In this process, the layered structure of a tungsten nitride film and a tungsten film is realized by adjusting the flow rate ratio of the nitrogen gas with respect to the argon gas within a range of 0 to 80%. Then, the conductive film 25 is subjected to a heat treatment using an electric furnace in a nitrogen gas at about 750° C. for about 30 minutes. Then, although not shown, the conductive film 25 is patterned by dry-etching so as to form the gate electrode, and a sidewall is formed on the side surface of the gate electrode, after which an impurity diffusion layer to be a source region and a drain region is formed in the silicon substrate 20. Note that ion implantation for the gate electrode is not necessary because the gate electrode formed in the present embodiment is a tungsten gate electrode.

In a MOSFET produced as described above is turned ON/OFF according to the level of the voltage applied to the tungsten gate electrode.

A measurement of the I-V characteristics of a MOSFET produced by the method for manufacturing a semiconductor device of the second embodiment illustrated in FIG. 3A to FIG. 3D showed that the gate leak current is about $6 \times 10^{-4}$ A/cm$^2$ when Vox (=gate voltage Vg–threshold voltage Vth) is 1.0 V, for example, indicating that the gate leak current is suppressed sufficiently. Note that the EOT of the Hf-containing silicon oxide film 24 of the second embodiment was calculated to be 1.5 nm based on the C-V characteristics (capacitance-voltage characteristics).

Moreover, the interface state density, which is believed to represent a characteristic of the interface between the silicon substrate 20 and the Hf-containing silicon oxide film 24 in the MOSFET of the present embodiment, was obtained by using a charge pumping method. As a result, the interface state density was estimated to be about $0.8 \times 10^{11}/(cm^2 \cdot eV)$ at each energy level in the mid-gap of the interface. This value is about twice as high as the interface state density of an SiO$_2$/Si interface, and it has been found that the interface state density is significantly reduced from that of a conventional high-k film. Needless to say, the interface state density at the interface between the silicon substrate 20 and the Hf-containing silicon oxide film 24 is preferably on the same level as that at an SiO$_2$/Si interface. However, the interface state density of the present embodiment as shown above is not problematic for the transistor characteristics.

It is believed that the desirable characteristics, as described above, of the Hf-containing silicon oxide film 24 as a high-k film can be obtained for the following reason.

According to the second embodiment, the Hf-containing silicon oxide film 24 is formed in a surface portion of the silicon substrate 20 by oxidizing the metal hafnium layer 22 on the silicon substrate 20 together with a surface portion of the silicon substrate 20. Since the Hf-containing silicon oxide film 24 formed in this manner has an equivalent level of amorphousness to that of a thermal oxide film, a leak path due to crystal grain boundaries is not likely to occur, whereby the leak current can be reduced significantly. Moreover, since the Hf-containing silicon oxide film 24 has a similar composition to that of a thermal oxide film, it can be a high-k film having a desirable heat resistance. Furthermore, as the oxidation process time increases, the interface b0 (see FIG. 3D) between the Hf-containing silicon oxide film 24 and the silicon substrate 20 moves downward with respect to the surface of the silicon substrate 20 before it is oxidized. Therefore, the surface contaminant 21 such as carbon or moisture on the silicon substrate 20, and the mixing layer or the defect 23 (i.e., a substrate damaged layer) occurring due to sputtering, are taken into the Hf-containing silicon oxide film 24. As a result, the interface b0 between the Hf-containing silicon oxide film 24 and the silicon substrate 20 has desirable interface characteristics, in which the trap level is reduced and the carrier scattering through the channel is reduced, as those of the interface between a thermal oxide film and a silicon substrate.

Therefore, by using the Hf-containing silicon oxide film 24 as a high-k film, it is possible to realize a sufficiently high dielectric constant as compared with, for example, a silicon nitride film or an aluminum oxide film (note however that the dielectric constant of the Hf-containing silicon oxide film 24 is slightly lower than that of a HfO$_2$ film, for example), while maintaining a high quality. Thus, with the Hf-containing silicon oxide film 24, it is possible to realize a reliable gate insulating film having desirable insulation and mobility characteristics, while achieving a very small electrical thickness that is even smaller than the limit value for the thickness of a thermal oxide film. Therefore, it is possible to suppress the gate leak current and reduce the power consumption without deteriorating the on state current of the transistor, whereby it is possible to manufacture a high-speed transistor with a very small stand-by power.

Moreover, according to the second embodiment, the Hf-containing silicon oxide film 24 is formed by performing a radical oxidation process using an oxygen radical on the metal hafnium layer 22 on the silicon substrate 20 and a surface portion of the silicon substrate 20. Therefore, as compared with an ordinary thermal oxidation process using an electric furnace, the oxidation rate in an initial oxidation stage is higher and the activity of the oxygen radical is higher. As a result, if the thickness of the Hf-containing silicon oxide film 24 is small, the interface b0 between the Hf-containing silicon oxide film 24 and the silicon substrate 20 can be made smooth on the atomic level, thereby improving the carrier mobility of the transistor. Moreover, since the Hf-containing silicon oxide film 24 is formed by a plasma oxidation process, the Hf-containing silicon oxide film 24 can be formed at a lower temperature than a conventional thermal oxide film.

Moreover, according to the second embodiment, the Hf-containing silicon oxide film 24, which is a high-k film, has a good heat resistance as that of a thermal oxide film, whereby a conventional process apparatus for manufacturing a conventional semiconductor device having a thermal oxide film as a gate insulating film can be used, as it is, for manufacturing a semiconductor device having the Hf-containing silicon oxide film 24 as a gate insulating film. Specifically, not only a conventional transistor manufacturing process, but also the front process and the end process thereof, can be used, as they are, thus providing a significant benefit in the manufacture of LSIs.

Moreover, in the second embodiment, the conductive film 25 having a layered structure of a tungsten nitride film and a tungsten film, i.e., a gate electrode made of a metal material, is formed on the Hf-containing silicon oxide film 24 to be a high-k gate insulating film. Therefore, a depletion layer is not formed inside the gate electrode when a voltage is applied to the electrode, whereby the effective equivalent oxide thickness (EOT) can be reduced by the thickness of the depletion layer, as compared with a case where a polysilicon gate electrode is used.

Furthermore, according to the second embodiment, an oxidation process is used for forming a high-k film, which provides the following advantage over the use of a conventional deposition method such as a CVD method for the high-k film formation.

That is, in the case of a conventional technique of forming a metal oxide film to be a high-k film on a silicon substrate by using, for example, a CVD method, it is necessary to form, before the formation of the metal oxide film, a barrier layer made of a silicon nitride film, or the like, on the silicon substrate, in order to suppress the growth of an interface layer between the silicon substrate and the metal oxide film. In contrast, in the second embodiment, the barrier layer formation can be omitted. Moreover, a conventional high-k film, i.e., a metal oxide film, formed by a CVD method needs to be subjected to a heat treatment for stabilizing the composition ratio thereof after the formation of the metal oxide film, whereas the heat treatment can be omitted in the second embodiment. Therefore, according to the second embodiment, the manufacturing process can be simplified as compared with the conventional high-k film formation method, and thus the manufacturing cost can be reduced.

Note that while a radical oxidation process is performed for forming the Hf-containing silicon oxide film 24 in the second embodiment, the thermal oxidation method may alternatively be any other suitable method, including an oxidation process using a plasma containing active ozone, a thermal oxidation process with an electric furnace, a rapid thermal oxidation process, an electrolytic oxidation process, etc. Note however that when a radical oxidation process is performed as in the second embodiment, the reliability of the Hf-containing silicon oxide film 24 as a high-k film is improved because the oxide film does not contain an OH group as does in a case where an oxidation process is performed in a pyrogenic atmosphere, for example.

Moreover, in the second embodiment, the Hf-containing silicon oxide film 24 to be a gate insulating film is formed by oxidizing the metal hafnium layer 22 on the silicon substrate 20 together with a surface portion of the silicon substrate 20. Alternatively, a metal-containing silicon oxide film to be a gate insulating film may be formed by forming an alternative metal layer containing a group III element (including a group IIIA element and a group IIIB element) such as a lanthanoid, an actinoid or aluminum, or a group IV element such as zirconium, on a silicon substrate, and then oxidizing the alternative metal layer together with a surface portion of the silicon substrate. For example, a metal zirconium (Zr) layer, a metal lanthanum (La) layer, or the like, on a silicon substrate may be oxidized together with a surface portion of the silicon substrate so as to form a Zr-containing silicon oxide film, a La-containing silicon oxide film, or the like, to be a gate insulating film.

Moreover, while tungsten nitride and tungsten are used as the materials of a gate electrode in the second embodiment, other metals, e.g., tantalum nitride or titanium nitride, may alternatively be used. Alternatively, polysilicon may be used as a material of a gate electrode.

Moreover, in the second embodiment, a super thin silicon nitride layer having a thickness of about 0.7 nm may be formed on the silicon substrate 20 by subjecting the silicon substrate 20 to a heat treatment for 20 seconds at 700° C., for example, in an ammonia gas atmosphere, before forming the metal hafnium layer 22 on the silicon substrate 20 in the step of FIG. 3B. The silicon nitride layer is provided for suppressing the interface reaction between the silicon substrate 20 and the metal hafnium layer 22.

Moreover, while the second embodiment is directed to a MOSFET in which a metal-containing silicon oxide film having a high dielectric constant is used as the gate insulating film, the present invention is not limited to this. Needless to say, similar effects can be obtained with any other suitable device using a metal-containing silicon oxide film such as a capacitor using a metal-containing silicon oxide film as a capacitor insulating film, for example.

What is claimed is:

1. A method for forming a semiconductor device, comprising the steps of:
   cleaning a surface of a substrate;
   forming a metal film contacting the cleaned substrate having a surface contaminant; and
   heating the metal film including the surface contaminant in an atmosphere including a hydrogen gas and an oxygen gas, so as to form a silicon oxide film including the metal.

2. A method for forming a semiconductor device, comprising the steps of:
   cleaning a surface of a substrate;
   forming a metal film contacting the cleaned substrate having a surface contaminant; and
   forming a silicon oxide film including the metal while oxidizing a portion of the substrate by oxidation species passing through the metal film, so as to take the surface contaminant into the silicon oxide film.

3. A method for forming a semiconductor device, comprising the steps of:
   forming a metal film contacting a silicon layer having a surface contaminant;
   forming a silicon oxide film including the metal while oxidizing a portion of the silicon layer in an atmosphere including a hydrogen gas and an oxygen gas; and
   forming an electrode on the silicon oxide film.

4. The method for forming a semiconductor device of claim 1, wherein the surface contaminant includes carbon or moisture.

5. The method for forming a semiconductor device of claim 2, wherein the surface contaminant includes carbon or moisture.

6. The method for forming a semiconductor device of claim 3, wherein the surface contaminant includes carbon or moisture.

7. The method for forming a semiconductor device of claim 2, wherein the step of forming the silicon oxide film includes a step of performing a thermal oxidation process on the substrate and the metal film.

8. The method for forming a semiconductor device of claim 1, wherein the heating step is performed by using infrared rays.

9. The method for forming a semiconductor device of claim 7, wherein the thermal oxidation process is performed by using infrared rays.

10. The method for forming a semiconductor device of claim 3, wherein the step of forming a silicon oxide film is performed by using infrared rays.

11. The method for forming a semiconductor device of claim 1, wherein the surface contaminant is taken into the silicon oxide film at the step of heating.

12. The method for forming a semiconductor device of claim 3, wherein the surface contaminant is taken into the silicon oxide film at the step of forming the silicon oxide film.

13. The method for forming a semiconductor device of claim 1, wherein the heating step is performed in a pyrogenic atmosphere.

14. The method for forming a semiconductor device of claim 2, wherein the step of forming the silicon oxide film is performed in a pyrogenic atmosphere.

15. The method for forming a semiconductor device of claim 1, wherein the metal includes a group III element or a group IV element.

16. The method for forming a semiconductor device of claim 2, wherein the metal includes a group III element or a group IV element.

17. The method for forming a semiconductor device of claim 16, wherein the group III element is a lanthanoid, an actinoid or aluminum, and the group IV element is hafnium or zirconium.

18. The method for forming a semiconductor device of claim 2, wherein the step of forming the silicon oxide film includes a step of performing a plasma oxidation process on a surface portion of the substrate and the metal film.

19. The method for fanning a semiconductor device of claim 2, wherein the step of forming the silicon oxide film includes a step of performing an electrolytic oxidation process on a surface portion of the substrate and the metal film.

20. The method for forming a semiconductor device of claim 1, wherein the step of cleaning the surface of the substrate is performed by a buffered hydrogen fluoride into which a hydrogen peroxide solution is mixed.

21. The method for forming a semiconductor device of claim 1, wherein the cleaned substrate also has a defect.

22. The method for forming a semiconductor device of claim 1, wherein the step of forming the metal film is performed by sputtering.

23. The method for forming a semiconductor device of claim 2, wherein the step of forming the metal film is performed by sputtering.

* * * * *